United States Patent
Horng et al.

(10) Patent No.: US 8,890,590 B1
(45) Date of Patent: Nov. 18, 2014

(54) WIDEBAND FREQUENCY SYNTHESIZER AND FREQUENCY SYNTHESIZING METHOD THEREOF

(71) Applicant: National Sun Yat-sen University, Kaohsiung (TW)

(72) Inventors: Tzyy-Sheng Horng, Kaohsiung (TW); Kang-Chun Peng, Kaohsiung (TW); Fu-Kang Wang, Kaohsiung (TW)

(73) Assignee: National Sun Yat-sen University, Kaohsiung (TW)

( * ) Notice: Subject to any disclaimer, the term of this patent is extended or adjusted under 35 U.S.C. 154(b) by 0 days.

(21) Appl. No.: 13/961,896

(22) Filed: Aug. 8, 2013

(30) Foreign Application Priority Data

May 6, 2013 (TW) .............................. 102116118 A

(51) Int. Cl.
*H03L 7/06* (2006.01)
*H03L 7/08* (2006.01)
(52) U.S. Cl.
CPC ........................................ *H03L 7/08* (2013.01)
USPC ........... 327/156; 327/157; 327/158; 375/371; 375/373; 375/376
(58) Field of Classification Search
USPC ........... 327/156, 157, 158; 375/371, 373, 376
See application file for complete search history.

(56) References Cited

U.S. PATENT DOCUMENTS

| | | | |
|---|---|---|---|
| 5,343,168 A | 8/1994 | Guthrie | |
| 5,771,730 A | 6/1998 | Huet | |
| 7,656,238 B2 | 2/2010 | Suh et al. | |
| 7,834,705 B2 | 11/2010 | Seo et al. | |
| 7,928,805 B2 | 4/2011 | Casagrande | |
| 8,040,194 B2 | 10/2011 | Gamliel | |
| 8,179,167 B2 | 5/2012 | Bagheri et al. | |
| 8,248,172 B2 | 8/2012 | Okada et al. | |
| 2007/0066262 A1 | 3/2007 | Mishra | |
| 2008/0007365 A1 | 1/2008 | Venuti et al. | |
| 2008/0233914 A1 | 9/2008 | Chen et al. | |
| 2011/0285435 A1* | 11/2011 | Okabe ............................ 327/156 | |
| 2012/0262239 A1 | 10/2012 | Taghivand et al. | |

FOREIGN PATENT DOCUMENTS

| | | |
|---|---|---|
| CN | 1960349 | 5/2007 |
| TW | 200924388 | 6/2009 |
| TW | 201012074 | 3/2010 |
| TW | 201032482 | 9/2010 |

OTHER PUBLICATIONS

Peng et al., "Enhancement of Frequency Synthesizer Operating Range Using a Novel Frequency-Offset Technique for LTE-A and CR Applications," IEEE Transactions on Microwave Theory and Techniques 61 (3), Mar. 2013, pp. 1215-1223.

* cited by examiner

*Primary Examiner* — John Poos
(74) *Attorney, Agent, or Firm* — Jianq Chyun IP Office

(57) ABSTRACT

A wideband frequency synthesizer and a frequency synthesizing method thereof are provided. The wideband frequency synthesizer includes a phase-locked loop unit, a first voltage-controlled oscillating unit and a first frequency mixer unit. The phase-locked loop unit receives a reference signal and a feedback signal and generates a first oscillating signal according to the reference signal and the feedback signal. The first voltage-controlled oscillating unit generates a second oscillating signal. The first frequency mixer is coupled to the phase-locked loop unit and the first voltage-controlled oscillating unit, receives the first oscillating signal and the second oscillating signal for mixing frequencies of the first oscillating signal and the second oscillating signal to generate an output signal and taking the output signal as the feedback signal for outputting to the phase-locked loop unit.

6 Claims, 3 Drawing Sheets

WIDEBAND FREQUENCY SYNTHESIZER AND FREQUENCY SYNTHESIZING METHOD THEREOF

CROSS-REFERENCE TO RELATED APPLICATION

This application claims the priority benefit of Taiwan application serial no. 102116118, filed on May 6, 2013. The entirety of the above-mentioned patent application is hereby incorporated by reference herein and made a part of this specification.

BACKGROUND

1. Technical Field

The invention relates to a frequency synthesizer and a frequency synthesizing method. Particularly, the invention relates to a wideband frequency synthesizer capable of improving a frequency operation range by additionally configuring a voltage-controlled oscillator and a frequency synthesizing method thereof.

2. Related Art

In recent years, along with booming development of wireless technology, wireless communication is widely used in people's daily life. Along with quick development of applications of communication techniques, demands on data transmission amount and data transmission speed are greatly increased, and a wide transmission bandwidth is generally required to improve a bit transmission rate. A main challenge of the wireless communication domain lies in a highly integrated and low cost complementary metal oxide semiconductor field effect transistor (CMOSFET) chip, and in a transceiver of a communication system, a frequency synthesizer is generally used to provide a stable local oscillating signal.

In detail, the frequency synthesizer provides the local oscillating signal required by the radio frequency (RF) transceiver in frequency up/down-conversion or linear modulation. Therefore, the quality of the local oscillating signal is an important factor determining a signal transmission quality. Especially, in a multi-carrier system, for example, an orthogonal frequency division modulation (OFDM) communication system, high-density orthogonal carriers have a more strict demanding on frequency spectrum purity of a local oscillation source. In a wireless application of a high application frequency, it must have a high performance requirement on the output signal generated by the frequency synthesizer, so as to generate a clean and stable local oscillating signal for integrating with the wireless transceiver.

Moreover, regarding the conventional frequency synthesizer, since there is only one voltage-controlled oscillator, the frequency operation range thereof is smaller, which cannot satisfy the demand on operation bandwidth in today's multi-standard communication system. Therefore, in order to apply in the system simultaneously complying with a plurality of different communication protocol standards, for example, IEEE 802.11b/g, 802.16d, ultra wide band, etc., the frequency synthesizer is required to have a wide operation frequency range when it is designed. A plurality of wideband frequency synthesizers are successively developed and discussed in recent years. The conventional wideband frequency synthesizer applies a plurality sets of phase-locked loop (PLL) circuits and a plurality sets of frequency dividers in collaboration with a multiplexer, such that the output frequency can fall in different application frequency bands. Moreover, a combination of a plurality of different frequency synthesizers can also result in the fact that the output frequency falls in different application frequency bands, so as to satisfy the demand of the wideband application.

However, in the conventional technique, not only a complicated hardware circuit design is required, a higher circuit cost and power consumption are also required. Regarding the frequency synthesizer having a plurality of frequency dividers, a balance has to be reached between a frequency resolution and the number of devices, and the operation frequency is hard to reach a continuous wideband range. On the other hand, if operation frequencies of two sets of PLL circuits are close to each other, a frequency pulling phenomenon is occurred, which decreases the quality of the output signal. Regarding an integrated circuit design of the frequency synthesizer in the current communication system, not only a high efficiency is required, a low cost is also required, so that it is an important issue to design a better wideband frequency synthesizer satisfying application requirements.

SUMMARY

Accordingly, the invention is directed to a wideband frequency synthesizer and a frequency synthesizing method thereof, by which an output frequency range of the wideband frequency synthesizer is broadened through a low complexity circuit design.

The invention provides a wideband frequency synthesizer including a phase-locked loop unit, a first voltage-controlled oscillating unit and a first frequency mixer unit. The phase-locked loop unit receives a reference signal and a feedback signal and generates a first oscillating signal according to the reference signal and the feedback signal. The first voltage-controlled oscillating unit generates a second oscillating signal. The first frequency mixer unit is coupled to the phase-locked loop unit and the first voltage-controlled oscillating unit, and receives the first oscillating signal and the second oscillating signal, and mixes frequencies of the first oscillating signal and the second oscillating signal to generate an output signal, and takes the output signal as the feedback signal for outputting to the phase-locked loop unit.

In an embodiment of the invention, the phase-locked loop unit includes a frequency divider, a phase frequency detector, a charge pump, a loop filter and a first voltage-controlled oscillator. The frequency divider is coupled to the first frequency mixer unit for receiving the feedback signal, and divides a frequency of the feedback signal to generate a frequency-divided feedback signal. The phase frequency detector is coupled to the frequency divider, and receives the reference signal and the frequency-divided feedback signal, and generates a phase difference signal according to the reference signal and the frequency-divided feedback signal. The charge pump is coupled to the phase frequency detector for receiving the phase difference signal, and generates a charging signal according to the phase difference signal. The loop filter is coupled to the charge pump for receiving the charging signal, and generates a control signal according to the charging signal. The first voltage-controlled oscillator is coupled to the loop filter for receiving the control signal, and generates the first oscillating signal according to the control signal.

In an embodiment of the invention, the frequency divider is an integer frequency divider or a fractional frequency divider.

In an embodiment of the invention, the first voltage-controlled unit includes a second voltage-controlled oscillator and a frequency selection unit. The second voltage controlled-oscillator generates the second oscillating signal. The frequency selection unit receives the second oscillating signal, and directly outputs the second oscillating signal or divides a frequency of the second oscillating signal to generate the frequency divided second oscillating signal.

In an embodiment of the invention, the first frequency mixer unit includes a frequency mixer, a frequency mixing filter and a selection unit. The frequency mixer is coupled to the phase-locked loop unit and the first voltage-controlled oscillating unit for receiving the first oscillating signal and the second oscillating signal, and mixes a frequency of the first oscillating signal by using the second oscillating signal to generate a frequency mixing signal. The frequency mixing filter is coupled to the frequency mixer for receiving the frequency mixing signal, and performs a low-pass filtering or a high-pass filtering on the frequency mixing signal to generate the filtered frequency mixing signal. The selection unit is coupled to the phase-locked loop unit and the frequency mixing filter, and selects to output the first oscillating signal or the frequency mixing signal to generate the output signal.

In an embodiment of the invention, the wideband frequency synthesizer further includes a pre-frequency dividing unit. The pre-frequency dividing unit is coupled between the frequency mixer unit and the phase-locked loop unit, and divides a frequency of the feedback signal to generate the frequency-divided feedback signal when the frequency of the feedback signal is higher than a predetermined value.

In an embodiment of the invention, the wideband frequency synthesizer further includes a second voltage-controlled oscillating unit and a second frequency mixer unit. The second voltage-controlled oscillating unit generates a third oscillating signal. The second frequency mixer unit is coupled between the first frequency mixer unit and the phase-locked loop unit, and is coupled to the second oscillating unit, and mixes a frequency of the first oscillating signal by using the third oscillating signal to generate the first oscillating signal mixed with the third oscillating signal.

The invention provides a frequency synthesizing method of a frequency synthesizer, which includes following steps. A phase-locked loop unit is provided, and the phase-locked loop unit generates a first oscillating signal according to a reference signal and a feedback signal. A voltage-controlled oscillating unit is provided, and the voltage-controlled oscillating unit generates a second oscillating signal. A frequency mixer unit is provided, and the frequency mixer unit mixes frequencies of the first oscillating signal and the second oscillating signal to generate an output signal, and take the output signal as the feedback signal for outputting.

According to the above descriptions, the frequency synthesizer applies the frequency mixer unit in collaboration with the phase-locked loop unit and the voltage-controlled oscillating unit, where the frequency mixer unit mixes frequencies of two oscillating signals output by the phase-locked loop unit and the voltage-controlled oscillating unit. Moreover, the frequency synthesizer of the invention further takes the output signal generated by the frequency mixer unit as the feedback signal, and feeds back the feedback signal to the phase-locked loop unit, such that the phase-locked loop unit is locked to a wider frequency range to accordingly generate the stable oscillating signal. In this way, the invention increases an applicable bandwidth of the wideband frequency synthesizer, and avoids a complicated hardware circuit design, so as to achieve an effect of low power consumption and low fabrication cost.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

The invention provides a wideband frequency synthesizer based on a phase-locked loop (PLL), and by combining another voltage-controlled oscillator with free oscillation and a frequency mixer, an operation bandwidth of the frequency synthesizer is increased. In the invention, a sum frequency signal or a difference frequency signal generated by the frequency mixer is output to the PLL unit to lock an output of the voltage-controlled oscillator in the PLL unit. In this way, the frequency synthesizer of the invention may have a continuous and wideband operation frequency range, so as to implement the wideband frequency synthesizer with a simple circuit structure. In order to clearly convey the concept of the present invention, embodiments are provided below for describing the present invention in detail.

Figure 1:
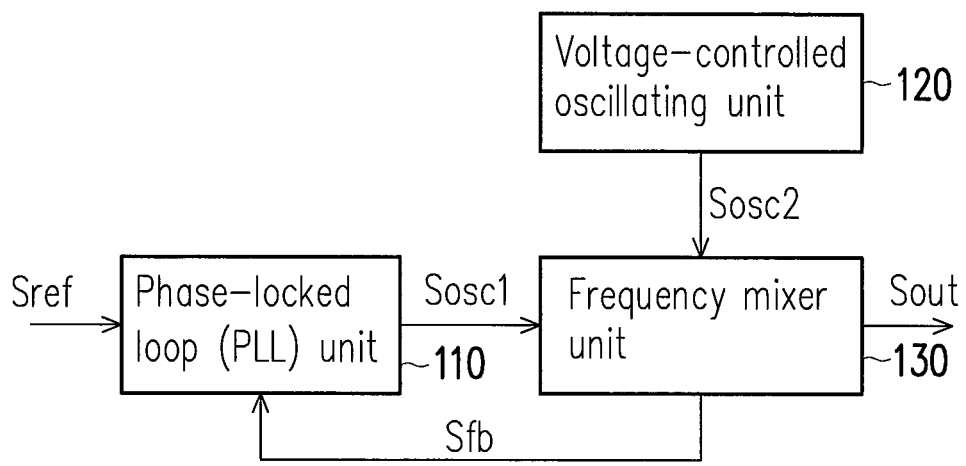
FIG. 1 is a schematic diagram of a wideband frequency synthesizer according to an embodiment of the invention.

FIG. 1 is a schematic diagram of a frequency synthesizer according to an embodiment of the invention. The frequency synthesizer 100 includes a phase-locked loop (PLL) unit 110, a voltage-controlled oscillating unit 120 and a frequency mixer unit 130. The frequency mixer unit 130 is coupled to the PLL unit 110 and the voltage-controlled oscillating unit 120. The PLL unit 110 receives a reference signal Sref and a feedback signal Sfb, and the PLL unit 110 generates a first oscillating signal Sosc1 according to the reference signal Sref and the feedback signal Sfb. Further, the PLL unit 110 is a negative feedback system, and in the present embodiment, the PLL unit 110 maintains a fixed phase relationship between a phase of the first oscillating signal Sosc1 and a phase of the reference signal Sref by using the feedback signal Sfb, and a frequency of the first oscillating signal Sosc1 also has a corresponding relationship due to a design of internal devices of the PLL unit 110.

Moreover, the voltage-controlled oscillating unit 120 generates a second oscillating signal Sosc2. In brief, the voltage-controlled oscillating unit 120 of the present embodiment includes a voltage-controlled oscillator for generating the second oscillating signal Sosc2. Therefore, the frequency mixer unit 130 receives the first oscillating signal Sosc1 and the second oscillating signal Sosc2, and mixes frequencies of the first oscillating signal Sosc1 and the second oscillating signal Sosc2 to generate an output signal Sout, and takes the output signal Sout as the feedback signal Sfb for outputting to the PLL unit 110. In detail, the frequency miser unit 130 respectively receives the first oscillating signal Sosc1 output by the PLL unit 110 and the second oscillating signal Sosc2 output by the voltage-controlled oscillating unit 120, and mixes the frequencies of the first oscillating signal Sosc1 and the second oscillating signal Sosc2. The frequency mixing operation may include generating a difference frequency signal by subtracting the frequencies of the first oscillating signal Sosc1 and the second oscillating signal Sosc2 and generating a sum frequency signal by adding the frequencies of the first oscillating signal Sosc1 and the second oscillating signal Sosc2

It should be noticed that the output signal Sout of the frequency synthesizer 100 can be the sum frequency signal or the difference frequency signal of the frequency mixer unit 130, or the first oscillating signal Sosc1 can be directly output to serve as the output signal Sout, which is not limited by the invention. For example, if the output signal Sout is the difference frequency signal generated by the frequency mixer unit 130, and it is assumed that the frequency of the first oscillating signal Sosc1 is f1 and the frequency of the second oscillating signal Sosc2 is f2, the frequency of the output signal Sout is |f2−f1|. If the output signal Sout is the sum frequency signal generated by the frequency mixer unit 130, the frequency of the output signal Sout is f2+f1.

It should be noticed that the feedback signal Sfb generated by the frequency mixer unit 130 is fed back to the PLL unit 110, and the voltage-controlled oscillator in the PLL unit 110 reaches a self-stable state. Namely, the frequency mixer unit 130 can generate the stable sum frequency signal and difference frequency signal according to the first oscillating signal Sosc1 and the second oscillating signal Sosc2. Therefore, even if the voltage-controlled oscillating unit 120 is in a free oscillation state, the frequency of the output signal Sout is still maintained stable. In this way, the frequency synthesizer of the invention can stably control dual oscillators through the single PLL, by which not only the circuit structure of the frequency synthesizer is simple, the applicable frequency range of the frequency synthesizer is also broadened. Moreover, if the feedback signal Sfb is the difference frequency signal, since a frequency of the difference frequency signal is lower, a locking time of the PLL unit can be shortened. Namely, the frequency operation range of the frequency synthesizer can be effectively increased by only using an additional oscillator and a mixer.

Figure 2:
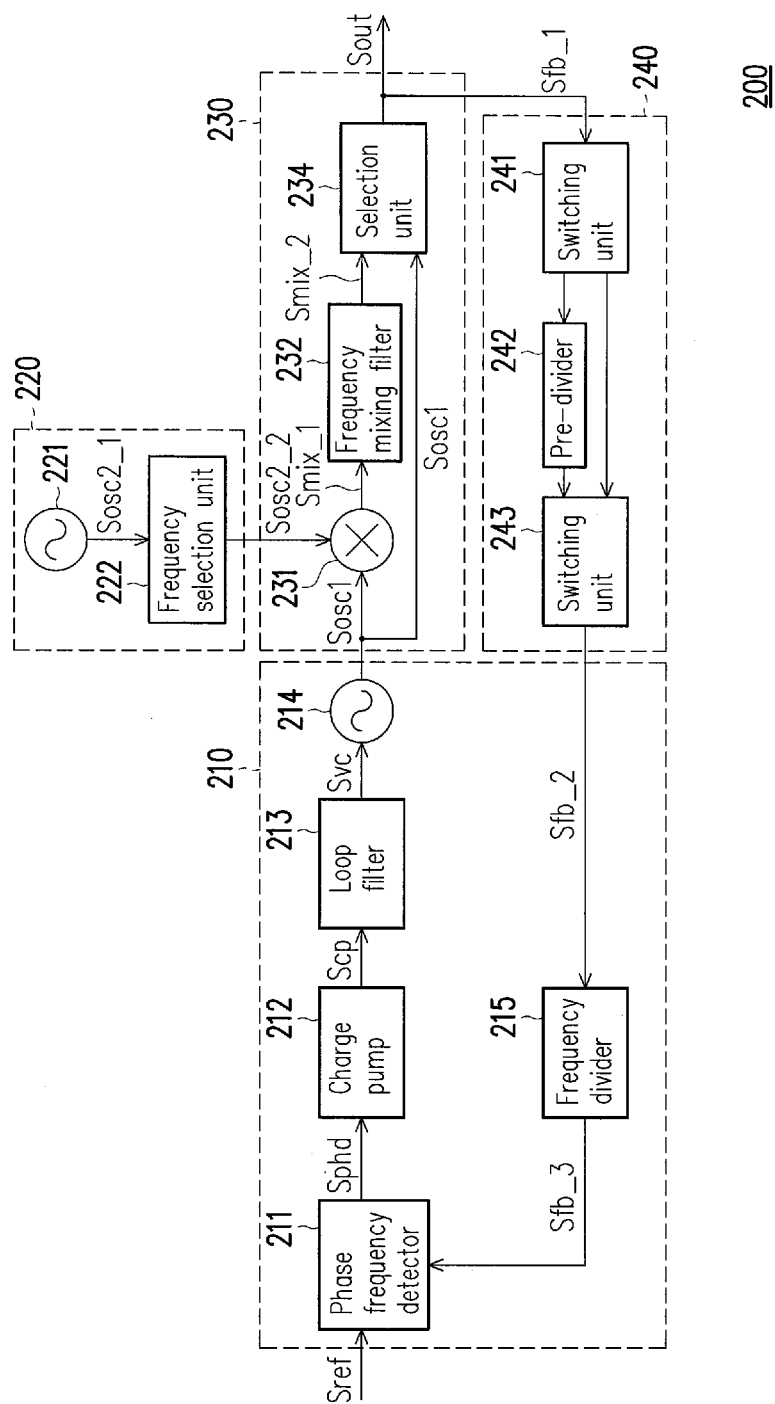
FIG. 2 is a schematic diagram of a wideband frequency synthesizer according to another embodiment of the invention.

FIG. 2 is a schematic diagram of a frequency synthesizer according to another embodiment of the invention. Referring to FIG. 2, the frequency synthesizer 200 includes a PLL unit 210, a voltage-controlled oscillating unit 220 and a frequency mixer unit 230, and coupling relations and functions thereof are the same or similar to that of the PLL unit 110, the voltage-controlled oscillating unit 120 and the frequency mixer unit 130, which are not repeated. A difference between the present embodiment and the aforementioned embodiment is that the frequency synthesizer 200 of the present embodiment further includes a pre-frequency dividing unit 240. The pre-frequency dividing unit 240 is coupled between the frequency mixer unit 230 and the PLL unit 210, and when a frequency of a feedback signal Sfb_1 is higher than a predetermined value, the pre-frequency dividing unit 240 divides the frequency of the feedback signal Sfb_1 to generate a frequency-divided feedback signal Sfb_2. In the present embodiment, the PLL unit 210, the voltage-controlled oscillating unit 220, the frequency mixer unit 230 and the pre-frequency dividing unit 240 are described in detail below.

The PLL unit 210 includes a phase frequency detector 211, a charge pump 212, a loop filter 213, a first voltage-controlled oscillator 214 and a frequency divider 215. The phase frequency detector 211 receives the reference signal Sref and a frequency-divided feedback signal Sfb_3, and generates a phase difference signal Sphd according to the reference signal Sref and the frequency-divided feedback signal Sfb_3. In brief, when the phase frequency detector 211 receives the reference signal Sref and the frequency-divided feedback signal Sfb_3, the phase frequency detector 211 compares frequency phases of the reference signal Sref and the frequency-divided feedback signal Sfb_3, and generates the phase difference signal Sphd according to a phase difference between the reference signal Sref and the frequency-divided feedback signal Sfb_3.

The charge pump 212 is coupled to the phase frequency detector 211 for receiving the phase difference signal Sphd, and generates a charging signal Scp according to the phase difference signal Sphd. When the charge pump 212 receives the phase difference signal Sphd, the charge pump 212 generates the corresponding charging signal Scp. For example, the charge pump 212 generates a corresponding charging pump current according to the phase difference signal Sphd, or generates a corresponding charging voltage while taking the phase difference signal Sphd as charging/discharging reference, which is not limited by the invention. Moreover, the loop filter 213 is coupled to the charge pump 212 for receiving the charging signal Scp, and generates a control signal Svc according to the charging signal Scp. Generally, the loop filter 213 is a low-pass filter, which is used for filtering noises in the charging signal Scp to generate a better control signal Svc.

The first voltage-controlled oscillator 214 is coupled to the loop filter 213 for receiving the control signal Svc, and generates the first oscillating signal Sosc1 according to the control signal Svc. Namely, an oscillation frequency of the first oscillating signal Sosc1 is changed as the control signal Svc changes. The frequency divider 215 is coupled to the pre-frequency dividing unit 240 for receiving the feedback signal Sfb_2 generated by the pre-frequency dividing unit 240, and divides a frequency of the feedback signal Sfb_2 to generate the frequency-divided feedback signal Sfb_3. In the present embodiment, the frequency divider 215 can be a multi-modulus integer frequency divider, and a provided divisor is a positive integer. For example, in an actual application of the invention, the divisor of the frequency divider 215 is 16, and when the feedback signal Sfb_2 is 2.4 GHz, the frequency-divided feedback signal Sfb_3 is 150 MHz. However, setting of the divisor is determined according to an actual application, and the divisor of the frequency divider 215 can also be set to 1, i.e. the feedback signal Sfb_2 is directly taken as the feedback signal Sfb_3 for outputting to the PLL detector 211 without performing the frequency dividing operation, though the invention is not limited thereto. It should be noticed that in another embodiment of the invention, the PLL unit 110 of the invention can also be a fractional PLL. In other words, the frequency divider 215 is not limited to the integer frequency divider, and the fractional PLL may further improve a frequency resolution.

Therefore, the PLL unit 210 of the present embodiment receives the feedback signal Sfb_2 output by the pre-frequency dividing unit 240, and divides the frequency of the feedback signal Sfb_2 to generate the frequency-divided feedback signal Sfb_3. Then, an output frequency of the voltage-controlled oscillator 214 is controlled by comparing a phase difference between the frequency-divided feedback signal Sfb_3 and the reference signal Sref. It should be noticed that the frequency divider 215 is generally a multi-modulus frequency divider. Therefore, in the present embodiment, the pre-frequency dividing unit 240 can be disposed in front of the frequency divider 215 for resolving a problem of low operation frequency of the multi-modulus frequency divider 215.

In detail, in the present embodiment, the pre-frequency dividing unit 240 includes a switching unit 241, a pre-divider 242 and a switching unit 243. If the frequency of the feedback signal Sfb_1 output by the frequency mixer unit 230 is greater than a predetermined value, and exceeds a frequency range that can be handled by the frequency divider 215, the switching unit 241 can output the signal to the pre-divider 242. In this way, the pre-divider 242 first performs low-modulus frequency dividing on the feedback signal Sfb_1 to generate the feedback signal Sfb_2 with a lower frequency, and the switching unit 243 outputs the feedback signal Sfb_2 to the PLL unit 210. If the frequency of the feedback signal Sfb_1 output by the frequency mixer unit 230 is not greater than the predetermined value, the switching unit 241 and the switching unit 243 directly take the feedback signal Sfb_1 as the feedback signal Sfb_2 for outputting.

According to the above descriptions, it is known that if the feedback signal Sfb_1 is the difference frequency signal generated by the frequency mixer unit 230, since the difference frequency signal is to a low frequency signal, the pre-frequency dividing unit 240 can directly output the difference frequency signal output by the frequency mixer unit 230, and the divisor of the frequency divider 215 is correspondingly smaller, so that the design of the frequency divider 215 is not complicated and is easy to be implemented. Besides, the frequency divider with a low divisor can speed the locking time of the PLL unit 210.

The voltage-controlled oscillating unit 220 includes a second voltage-controlled oscillator 221 and a frequency selection unit 222. The second voltage-controlled oscillator 221 is used for generating the second oscillating signal Sosc2_1. The frequency selection unit is coupled to the second voltage-controlled oscillator 221 for receiving the second oscillating signal Sosc2_1, and directly outputs the second oscillating signal Sosc2_1 or divides the frequency of the second oscillating signal Sosc2_1 to output the second oscillating signal Sosc2_2. Setting of the frequency selection unit 222 is determined according to an actual application requirement, which is not limited by the invention.

The frequency mixer unit 230 includes a frequency mixer 231, a frequency mixing filter 232 and a selection unit 234. The frequency mixer 231 is coupled to the PLL unit 210 and the voltage-controlled oscillating unit 221 for receiving the first oscillating signal Sosc1 and the second oscillating signal Sosc2_2, and mixes the frequency of the first oscillating signal Sosc1 by using the second oscillating signal Sosc2_2 to generate a frequency mixing signal Smix_1. In brief, the frequency mixer 231 mixes two signals with different frequencies, and outputs a sum frequency signal or a difference frequency signal to achieve a frequency up/down-conversion effect. For example, the frequency mixer 231 can be implemented by a double-balanced passive switching mixer circuit, though the invention is not limited thereto. According to the above embodiment, it is known that the voltage-controlled oscillator in the PLL unit 210 in the wideband frequency synthesizer of the invention can be locked by the feedback signal. In this way, the sum frequency signal and the difference frequency signal generated by the frequency mixer 231 are all stable signals, and both have a good phase noise performance.

Moreover, the frequency mixing filter 232 is coupled to the frequency mixer 231 for receiving the frequency mixing signal Smix_1, and performs a low-pass filtering or a high-pass filtering on the frequency mixing signal Smix_1 to generate the filtered frequency mixing signal Smix_2. In brief, through selection and design of the frequency mixing filter 232, the high-frequency sum frequency signal or the low-frequency difference frequency signal of the frequency mixing signal Smix_1 is obtained. Namely, the frequency mixing filter 232 can be a low-pass filter for filtering the high-frequency components of the frequency mixing signal Smix_1 to generate a pure frequency mixing signal Smix_2 serving as the difference frequency signal. Conversely, if the frequency mixing filter 232 is a high-pass filter, the frequency mixing filter 232 can be used to filter the low-pass components and noises in the frequency mixing signal Smix_1 to generate the pure frequency mixing signal Smix_2 serving as the sum frequency signal. The frequency mixing filter 232 can be set and configured according to an actual application requirement, which is not limited by the invention.

The selection unit 234 is coupled to the PLL unit 210 and the frequency mixing filter 232, and selects to output the first oscillating signal Sosc1 or the frequency mixing signal Smix_2 to generate the output signal Sout. Further, through selection of the selection unit 234, the first oscillating signal Sosc1 or the frequency mixing signal Smix_2 can be selected to serve as the output signal Sout of the wideband frequency synthesizer. According to the above descriptions, through control and setting of the frequency mixing filter 232 and the selection unit 234, the oscillating signal output by the voltage-controlled oscillator 214 can be directly output, or the sum frequency signal or the difference frequency signal of two oscillating signals can be output. Namely, the frequency synthesizer 200 of the present embodiment can simultaneously obtain the difference frequency signal and the sum frequency signal of dual voltage-controlled oscillator through the frequency mixing technique, and in collaboration with the negative feedback mechanism of the PLL, a single control loop is formed and the PLL unit can lock the output of the voltage-controlled oscillator by using the difference frequency signal or the sum frequency signal, such that the frequency operation range of the wideband frequency synthesizer can be greatly broadened.

A frequency synthesizing method of the frequency synthesizer is deduced as follows. First, a PLL unit is provided, and the PLL unit generates a first oscillating signal according to a reference signal and a feedback signal (step S301). Then, a voltage-controlled oscillating unit is provided, and the voltage-controlled oscillating unit generates a second oscillating signal (step S302). Then, a frequency mixer unit is provided, and the frequency mixer unit mixes frequencies of the first oscillating signal and the second oscillating signal to generate an output signal, and take the output signal as the feedback signal for outputting (step S303). In this way, according to the frequency synthesizing method of the invention, it is only required to additionally configure a voltage-controlled oscillator and a frequency mixer on the PLL structure to greatly increase the frequency operation range of the frequency synthesizer.

Figure 3:
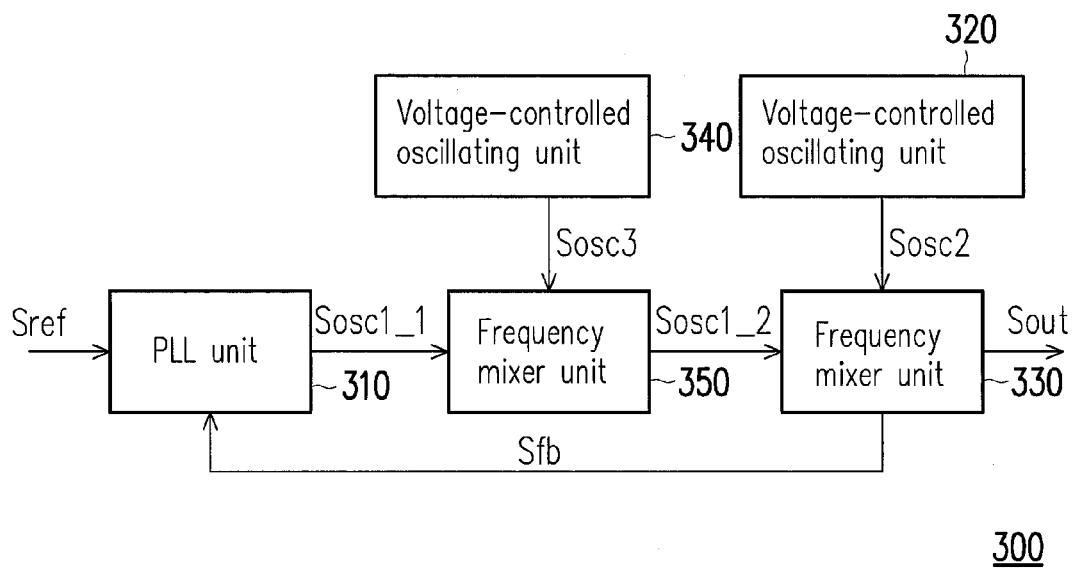
FIG. 3 is a schematic diagram of a wideband frequency synthesizer according to still another embodiment of the invention.

FIG. 3 is a schematic diagram of a frequency synthesizer according to another embodiment of the invention. Referring to FIG. 3, the wideband frequency synthesizer 300 includes a PLL unit 310, a voltage-controlled oscillating unit 320 and a frequency mixer unit 330, where functions thereof are the same or similar to the PLL unit 110, the voltage-controlled oscillating unit 120 and the frequency mixer unit 130 of the aforementioned embodiment, which are not repeated. A difference between the present embodiment and the aforementioned embodiment is that the frequency synthesizer 300 of the present embodiment further includes a voltage-controlled oscillating unit 340 and a frequency mixer unit 350. The voltage-controlled oscillating unit 340 is used for generating a third oscillating signal Sosc3. The frequency mixer unit 350 is coupled between the frequency mixer unit 330 and the PLL unit 310, and is coupled to the voltage-controlled oscillating unit 340, and is used for mixing the frequency of the first oscillating signal Sosc1_1 by using the third oscillating signal Sosc3 to generate the first oscillating signal Sosc1_2 mixed with the third oscillating signal Sosc3. In brief, different to the aforementioned embodiment, the frequency of the first oscillating signal output by the PLL unit 310 is further mixed by the other frequency mixer 350. In this way, two frequency units and two voltage-controlled oscillating units can be configured according to an actual application requirement, such that a frequency band of the output signal is broadened, and the output signal can also reach a stable state through locking of a single PLL, and the frequency operation range of the wideband frequency synthesizer 300 is broadened.

In summary, the frequency synthesizer mixes frequencies of the oscillating signals generated by two voltage-controlled oscillators to generate the difference frequency signal and the sum frequency signal of the dual oscillating signal. Then, the difference frequency signal or the sum frequency signal is used to lock the voltage-controlled oscillator in the PLL, such that the difference frequency signal and the sum frequency signal all have a good phase noise performance to stabilize the output signal of the frequency mixer and broaden the applicable bandwidth of the frequency synthesizer. Moreover, due to the use of the difference frequency signal generated by the frequency mixer unit, the operation frequency of the frequency divider is decreased through the low-frequency loop control and the low-frequency feedback, such that the frequency divider is easy to overcome obstacles of the high-frequency circuit design. Therefore, the circuit structure complexity of the frequency synthesizer is decreased to achieve effects of low-power consumption, low cost and fast locking time.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A wideband frequency synthesizer, comprising:
   a phase-locked loop unit, receiving a reference signal and a feedback signal, and generating a first oscillating signal according to the reference signal and the feedback signal;
   a first voltage-controlled oscillating unit, generating a second oscillating signal; and
   a first frequency mixer unit, coupled to the phase-locked loop unit and the first voltage-controlled oscillating unit, receiving the first oscillating signal and the second oscillating signal, and mixing frequencies of the first oscillating signal and the second oscillating signal to generate an output signal, and taking the output signal as the feedback signal for outputting to the phase-locked loop unit, wherein the first frequency mixer unit comprises:
      a frequency mixer, coupled to the phase-locked loop unit and the first voltage-controlled oscillating unit, receiving the first oscillating signal and the second oscillating signal, and mixing a frequency of the first oscillating signal by using the second oscillating signal to generate a frequency mixing signal;
      a frequency mixing filter, coupled to the frequency mixer, receiving the frequency mixing signal, and performing a low-pass filtering or a high-pass filtering on the frequency mixing signal to generate the filtered frequency mixing signal; and
      a selection unit, coupled to the phase-locked loop unit and the frequency mixing filter, and selecting to output the first oscillating signal or the frequency mixing signal to generate the output signal.

2. The wideband frequency synthesizer as claimed in claim 1, wherein the phase-locked loop unit comprises:
   a frequency divider, coupled to the first frequency mixer unit, receiving the feedback signal, and dividing a frequency of the feedback signal to generate a frequency-divided feedback signal;
   a phase frequency detector, coupled to the frequency divider, receiving the reference signal and the frequency-divided feedback signal, and generating a phase difference signal according to the reference signal and the frequency-divided feedback signal;
   a charge pump, coupled to the phase frequency detector, receiving the phase difference signal, and generating a charging signal according to the phase difference signal;
   a loop filter, coupled to the charge pump, receiving the charging signal, and generating a control signal according to the charging signal; and
   a first voltage-controlled oscillator, coupled to the loop filter, receiving the control signal, and generating the first oscillating signal according to the control signal.

3. The wideband frequency synthesizer as claimed in claim 2, wherein the frequency divider is an integer frequency divider or a fractional frequency divider.

4. The wideband frequency synthesizer as claimed in claim 1, wherein the first voltage-controlled unit comprises:
   a second voltage-controlled oscillator, generating the second oscillating signal; and
   a frequency selection unit, coupled to the second voltage-controlled oscillator, receiving the second oscillating signal, and directly outputting the second oscillating signal or dividing a frequency of the second oscillating signal to generate the frequency-divided second oscillating signal.

5. The wideband frequency synthesizer as claimed in claim 1, further comprising:
   a pre-frequency dividing unit, coupled between the frequency mixer unit and the phase-locked loop unit, and dividing a frequency of the feedback signal to generate the frequency-divided feedback signal when the frequency of the feedback signal is higher than a predetermined value.

6. The wideband frequency synthesizer as claimed in claim 1, further comprising:
   a second voltage-controlled oscillating unit, generating a third oscillating signal; and
   a second frequency mixer unit, coupled between the first frequency mixer unit and the phase-locked loop unit, and coupled to the second oscillating unit, and mixing a frequency of the first oscillating signal by using the third oscillating signal to generate the first oscillating signal mixed with the third oscillating signal.

* * * * *